(12) United States Patent
Qin

(10) Patent No.: US 12,191,180 B2
(45) Date of Patent: Jan. 7, 2025

(54) OVERHEAD BUFFER DOUBLE-ENTRY DETECTION SYSTEM AND METHOD THEREOF

(71) Applicant: CHANGXIN MEMORY TECHNOLOGIES, INC., Hefei (CN)

(72) Inventor: Yuanzhang Qin, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 826 days.

(21) Appl. No.: 17/423,642

(22) PCT Filed: May 18, 2021

(86) PCT No.: PCT/CN2021/094246
§ 371 (c)(1),
(2) Date: Jul. 16, 2021

(87) PCT Pub. No.: WO2021/238714
PCT Pub. Date: Dec. 2, 2021

(65) Prior Publication Data
US 2022/0344188 A1 Oct. 27, 2022

(30) Foreign Application Priority Data

May 29, 2020 (CN) .......................... 202010474358.3

(51) Int. Cl.
*H01L 21/677* (2006.01)
*B65G 49/07* (2006.01)

(52) U.S. Cl.
CPC ........ *H01L 21/67733* (2013.01); *B65G 49/07* (2013.01)

(58) Field of Classification Search
CPC ........ H01L 21/67733; H01L 21/67259; B65G 49/07; B66C 13/16; B66C 13/18;
(Continued)

(56) References Cited

U.S. PATENT DOCUMENTS 6,092,678 A 7/2000 Kawano
6,504,144 B1 * 1/2003 Murata ............. H01L 21/67259
340/673
(Continued)

FOREIGN PATENT DOCUMENTS

CN 1150254 A 5/1997
CN 101200242 A 6/2008
(Continued)

OTHER PUBLICATIONS

OA corresponding to counterpart application 202010474358.3 dated Mar. 17, 2022.
(Continued)

*Primary Examiner* — Jacob S. Scott
*Assistant Examiner* — Erin Morris
(74) *Attorney, Agent, or Firm* — Kilpatrick Townsend & Stockton LLP

(57) ABSTRACT

An overhead buffer double-entry detection system, which includes an overhead hoist transport, a first sensing unit for scanning and generating detection data of a horizontal range, a driving device for moving the first sensing unit in a vertical range, a controlling unit, and an overhead hoist transport controlling system for sending a detection instruction and a driving instruction to the controlling unit when the overhead hoist transport moves to a corresponding overhead buffer position, whereby the controlling unit bases on the driving instruction to control the driving device to move the first sensing unit in a vertical range, bases on the detection instruction to control the first sensing unit to scan and generate detection data of each horizontal range within the overhead buffer during movement process, and bases on the detection data of each horizontal range within the overhead buffer to judge whether there is obstacle in the overhead buffer.

12 Claims, 5 Drawing Sheets

(58) Field of Classification Search
CPC ....... B66C 15/06; B66C 15/065; G01B 11/00; G01V 8/26
See application file for complete search history.

(56) References Cited

U.S. PATENT DOCUMENTS

| | | | |
|---|---|---|---|
| 6,592,080 B2 * | 7/2003 | Murata | B61L 23/005 |
| | | | 246/167 R |
| 6,791,074 B2 | 9/2004 | Hanh et al. | |
| 8,882,433 B2 * | 11/2014 | Bonora | H01L 21/67775 |
| | | | 414/940 |
| 8,944,739 B2 | 2/2015 | Chen | |
| 9,117,853 B2 | 8/2015 | Tsubaki | |
| 2003/0005561 A1 * | 1/2003 | Hahn | H01L 21/67259 |
| | | | 29/25.01 |
| 2004/0118980 A1 * | 6/2004 | Chang | H01L 21/6773 |
| | | | 246/1 C |
| 2008/0128374 A1 | 6/2008 | Kyutoku | |
| 2013/0322990 A1 | 12/2013 | Chen | |

FOREIGN PATENT DOCUMENTS

| | | |
|---|---|---|
| CN | 102508246 A | 6/2012 |
| CN | 102971657 A | 3/2013 |
| CN | 103253599 A | 8/2013 |
| CN | 104555743 A | 4/2015 |
| CN | 106133630 A | 11/2016 |
| CN | 206417790 U | 8/2017 |
| CN | 109470357 A | 3/2019 |
| CN | 209065300 U | 7/2019 |
| IN | 101143686 A | 3/2008 |
| JP | H07215669 A | 8/1995 |
| JP | 4465415 B2 * | 5/2010 |
| KR | 20020043124 A | 6/2002 |
| KR | 20150049649 A | 5/2015 |
| TW | 494079 B | 7/2002 |

OTHER PUBLICATIONS

International Search Report in the international application No. PCT/CN2021/094246, mailed on Aug. 20, 2021.
English translation of the Written Opinion of the International Search Authority in the international application No. PCT/CN2021/094246, mailed on Aug. 20, 2021.
Notice of Allowance of the Chinese application No. 202010474358.3, issued on Oct. 19, 2022.

* cited by examiner

OVERHEAD BUFFER DOUBLE-ENTRY DETECTION SYSTEM AND METHOD THEREOF

CROSS-REFERENCE TO RELATED APPLICATIONS

The present application is a national phase entry of International Patent Application No. PCT/CN2021/094246, filed on May 18, 2021, which claims priority to Chinese Patent Application No. 202010474358.3, filed on May 29, 2020. The disclosures of the aforementioned patent applications are incorporated by reference in their entireties.

TECHNICAL FIELD

The present application relates to an overhead buffer double-entry detection system and a method thereof.

BACKGROUND

The automated material handling system (AMHS) in a semiconductor integrated circuit includes an overhead hoist transport (OHT) moving along tracks disposed below the ceiling, and an overhead buffer (OHB) mounted below the ceiling, of which the overhead buffer is a storage rack for disposing front opening unified pods (FOUPs), and the overhead hoist transport is employed to convey the FOUPs to destination sites.

SUMMARY

The present application proposes an overhead buffer double-entry detection system and a method thereof, whereby precise detection of double entry can be realized.

According to plural embodiments, a first aspect of the present application provides an overhead buffer double-entry detection system, which comprises:

an overhead hoist transport;

a first sensing unit, for scanning and generating detection data of a horizontal range;

a driving device, disposed on the overhead hoist transport, and connected to the first sensing unit, for moving the first sensing unit in a vertical range;

a controlling unit, connected to the driving device and the first sensing unit respectively; and an overhead hoist transport controlling system, connected to the overhead hoist transport and the controlling unit respectively, for sending a detection instruction and a driving instruction to the controlling unit when the overhead hoist transport moves to a corresponding overhead buffer position, whereby the controlling unit bases on the driving instruction to control the driving device to move the first sensing unit in a vertical range, bases on the detection instruction to control the first sensing unit to scan and generate detection data of each horizontal range within the overhead buffer during movement process, and sends the detection data of each horizontal range within the overhead buffer to the overhead hoist transport controlling system, and the overhead hoist transport controlling system bases on the detection data of each horizontal range within the overhead buffer to judge whether there is obstacle in the overhead buffer.

According to a plurality of embodiments, a second aspect of the present application provides an overhead buffer double-entry detecting method, which method comprises:

controlling an overhead hoist transport to move to a corresponding position of an overhead buffer;

triggering a first sensing unit, controlling a driving device to move the first sensing unit in a vertical range, and enabling the first sensing unit to scan and generate detection data of each horizontal range within the overhead buffer during movement process, wherein the driving device is disposed on the overhead hoist transport, and the first sensing unit is connected to the driving device; and basing on the detection data of each horizontal range within the overhead buffer to judge whether there is obstacle in the overhead buffer.

Details of one or more embodiments of the present application are enunciated below in the following accompanying drawings and descriptions. Other characteristics and advantages of the present application will become more apparent from the description, accompanying drawings and claims.

BRIEF DESCRIPTION OF DRAWINGS

To describe more clearly the technical solutions in the embodiments of the present application or in prior-art, conventional technologies, accompanying drawings necessarily used in describing the current embodiments or prior-art technologies are briefly introduced below; apparently, the accompanying drawings described below are merely directed to some embodiments of the present application, and persons ordinarily skilled in the art may also acquire other drawings from these accompanying drawings without spending creative effort in the process.

Figure 1:
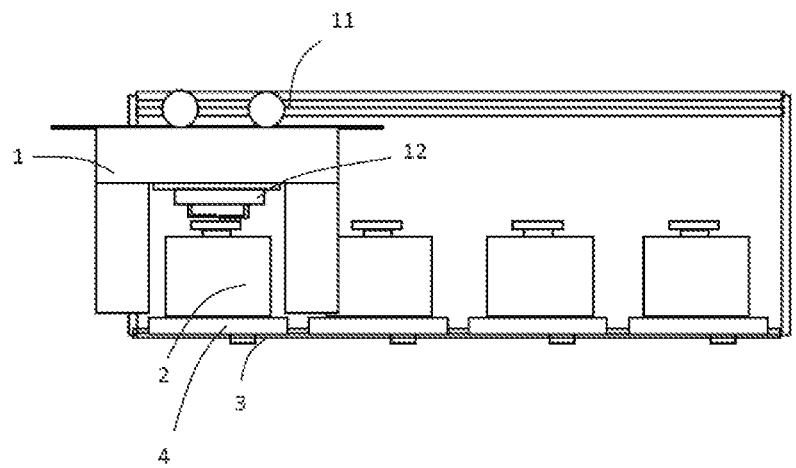
FIG. 1 is a main view of a currently available overhead buffer double-entry detection system.

REFERENCE NUMERALS 1. overhead hoist transport;
11. walking part;
12. load transfer part;
2. front opening unified pod (FOUP);
2a. object;
2b. FOSE-type opening unified pod;
3. reflection board;
4. overhead buffer;

5. first sensing unit;
51. detectable region;
511. horizontal range;
52. vertical range;
6. leading screw;
7. sliding block;
8. motor;
9. block piece;
91. second sensing unit;
92. third sensing unit.

DESCRIPTION OF EMBODIMENTS

In the state of the art, when the overhead hoist transport moves to a corresponding overhead buffer position to dispose a FOUP, it is firstly required to detect whether there is object in the overhead buffer, and such detection process is referred to as double-input detection. Double-input detection is currently carried out via photoelectric sensors, but the current detection mode is not high in precision as there are potential missed detections and erroneous detections.

In order to make the aforementioned objectives, characteristics and advantages of the present application more apparent and comprehensible, specific embodiments of the present application will be described in greater detail below with reference to the accompanying drawings. Many specific details are enunciated below for a fuller understanding of the present application. However, the present application can be implemented by other modes different from those described in this context, and persons skilled in the art may make similar improvements without departing from the conception of the present application, so the present application is not restricted to the specific embodiments made public below.

As should be understood, directions or positional relations indicated by such wordings as "vertical" and "horizontal" used in the description of the present application are directed to directions or positional relations on the basis of the accompanying drawings, and are used merely to facilitate description of the present application and simplify the description, whereas they are not to be construed as indicating or implying specific directions necessarily possessed by the indicated devices or elements, or necessarily configuring and operating the indicated devices or elements by certain directions, so they are not to be understood as restrictions to the present application.

Moreover, technical wordings "first" and "second" are used merely for the purpose of description, and should not be understood as indicating or implying relative importance or the number of technical features implied or indicated thereby. Accordingly, features defined by "first", "second" can explicate or implicate the inclusion of at least one such feature. In the description of the present application, "a plurality of", "plural" mean the inclusion of at least two, for instance, two, or three, unless otherwise definitely defined.

In the present application, unless otherwise definitely prescribed or defined, such technical terms as "mount", "being connected to", "connect with" and "fixing/fixed" should be understood in their broad sense, for instance, the connection may be fixed, detachable, integrated, mechanical, electrical, direct, or indirect through an intermediary, and the connection may be internal communication of two elements or complementary interrelation between two elements, unless definitely defined otherwise. To persons ordinarily skilled in the art, specific meanings of such technical terms as they are used in the present application can be understood according to specific circumstances.

As should be noted, when an element is referred to as being "fixed on" or "disposed at" another element, it can be directly on the other element or there may be an intermediate element. When an element is referred to as being "connected to" another element, it can be directly connected to the other element or there may be an intermediate element at the same time. Such technical wordings as "perpendicular", "horizontal", "above", "below", "left", "right" and similar expressions as used in this context are merely for the purpose of description, and are not used to indicate exclusive modes of implementation.

Figure 2:
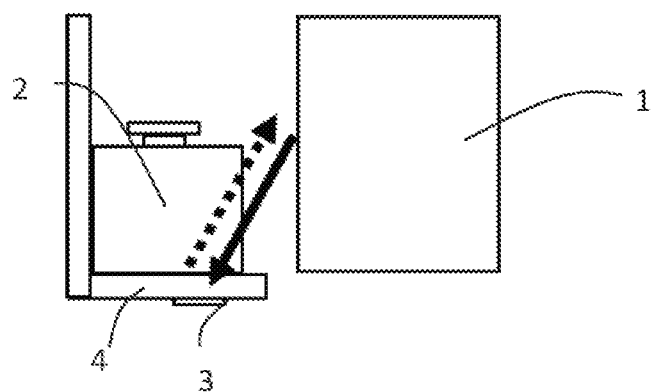
FIG. 2 is a diagram schematically illustrating the detection process in the system of FIG. 1 when a conventional FOUP is present in the overhead buffer.

Referring to FIGS. 1 and 2, the currently available overhead hoist transport 1 is usually provided with a photoelectric sensor thereon; when it is required for the overhead hoist transport 1 to place a FOUP 2 on the overhead buffer 4, the overhead hoist transport 1 walks on track via the walking part 11 to move to a designated position of the overhead buffer 4, and it is subsequently ascertained via a photoelectric sensor (usually a single-beam photoelectric sensor) as to whether the FOUP 2 has already existed on the overhead buffer 4; specifically, the photoelectric sensor would send a light beam to a reflection board 3 for double-entry detection under the overhead buffer 4, and it is judged whether there is object on the overhead buffer 4 by judging whether the light beam is reflected back from the reflection board 3—in this context, double-entry means the disposal of a new object on the overhead buffer 4 on which an object already exists.

Figure 3:
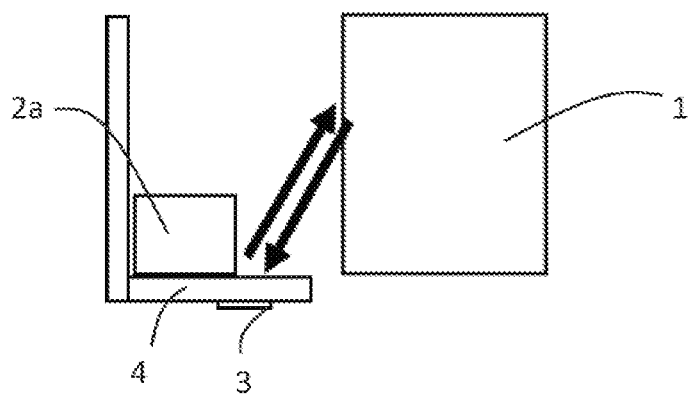
FIG. 3 is a diagram schematically illustrating the detection process in the system of FIG. 1 when foreign matter is present in the overhead buffer.
Figure 4:
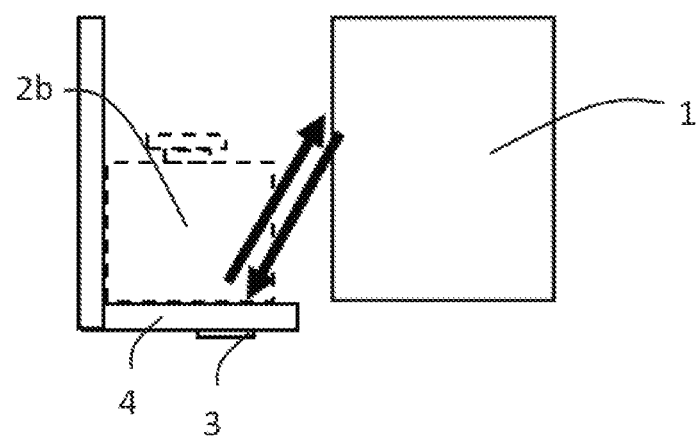
FIG. 4 is a diagram schematically illustrating the detection process in the system of FIG. 1 when a transparent FOUP is present in the overhead buffer.

As shown in FIGS. 3 and 4, under certain circumstances, when a lesser object 2a so small on the overhead buffer 4 that it cannot shield the light beam emitted by the photoelectric sensor, this easily leads to missed detection, i.e., there is a problem that the detection range is small; under other circumstances, when the FOUP on the overhead buffer 4 is a FOSE-type FOUP 2b, since the FOSE-type FOUP 2b is itself transparent, the light beam emitted by the photoelectric sensor can penetrate through it and reflection light is reflected back via the reflection board 3, thus leading to erroneous detection result obtained by feedback, i.e., this also causes erroneous detection.

Figure 5:
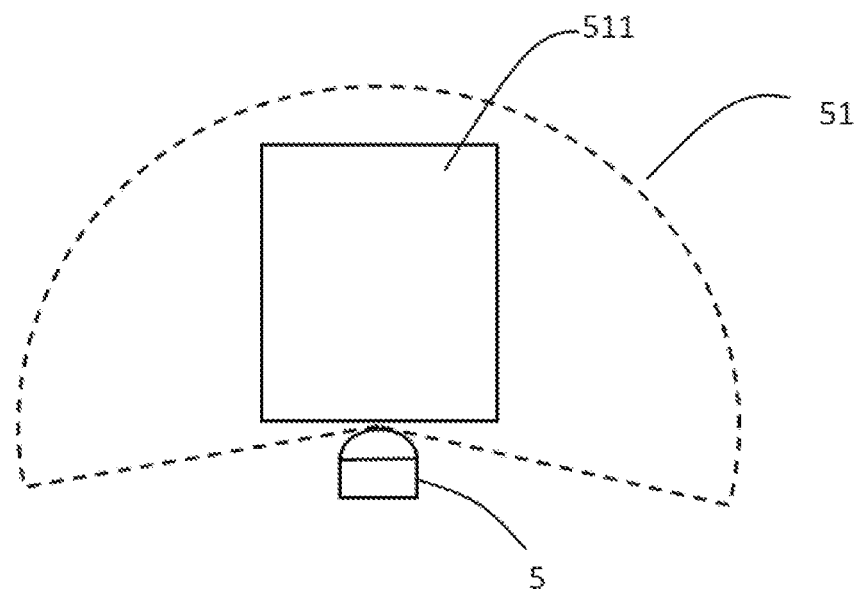
FIG. 5 is a diagram illustrating the operational principle of the first sensing unit in the overhead buffer double-entry detection system according to the present application.
Figure 6:
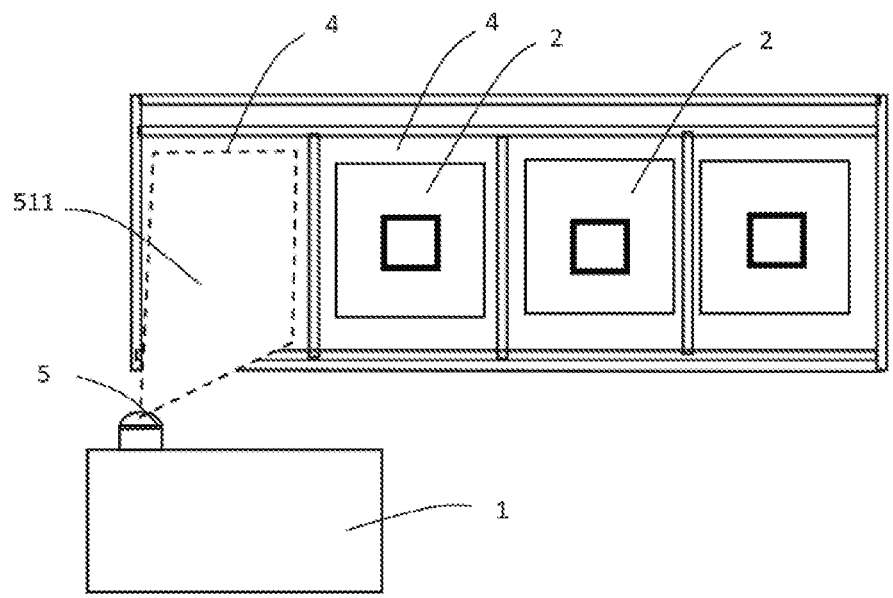
FIG. 6 is a vertical view of the overhead buffer double-entry detection system according to the present application.
Figure 7:
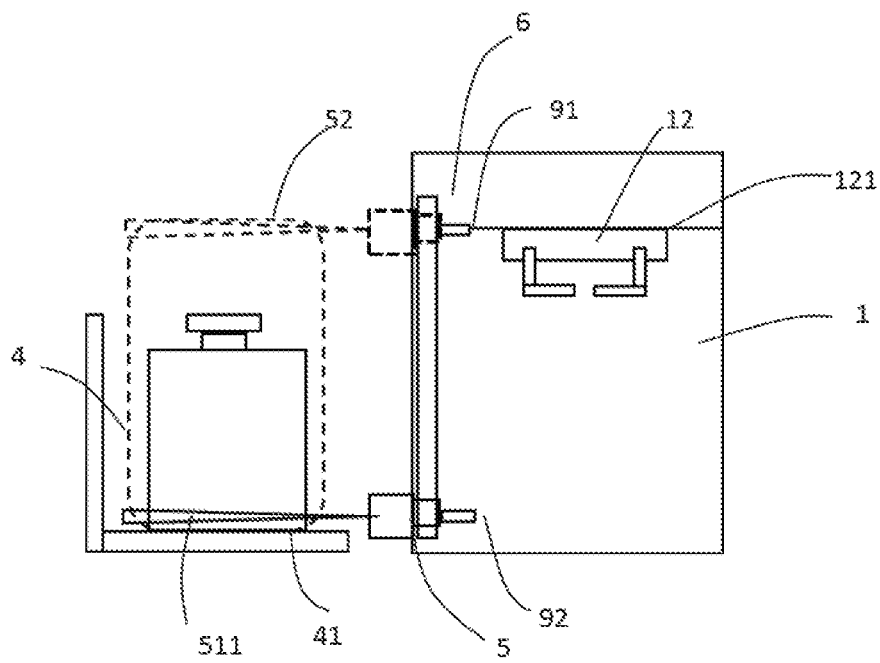
FIG. 7 is a diagram schematically illustrating the detection process of the overhead buffer double-entry detection system according to the present application.

FIGS. 6 and 7 show an overhead buffer double-entry detection system in an embodiment of the present application, the system comprises an overhead hoist transport 1, a first sensing unit 5, a driving device, a controlling unit (not shown) and an overhead hoist transport controlling system (not shown); the first sensing unit 5 is employed to scan and generate detection data of a horizontal range 511, as shown in FIG. 5, the first sensing unit 5 makes use of a sensor capable of realizing horizontal scanning, and it has a detectable horizontal detection region 51, which is usually a planar fan-shaped region, in which it is possible to set the horizontal range 511 practically needed to be detected (shape setting is subjected to modification via parameters) according to the range actually to be monitored; by way of example, the first sensing unit 5 may be selected from an obstacle scanning sensor; the driving device is disposed on the overhead hoist transport 1 and connected to the first sensing unit 5 for moving the first sensing unit 5 in a vertical range; the controlling unit is connected to the driving device and the first sensing unit 5 respectively; the overhead hoist transport controlling system is connected to the overhead hoist transport 1 and the controlling unit respectively, and is employed for sending a detection instruction and a driving instruction to the controlling unit when the overhead hoist transport 1 moves to a corresponding position of the overhead buffer 4; the controlling unit bases on the driving instruction to control the driving device to move the first sensing unit 5 in the vertical range 52, bases on the detection instruction to control the first sensing unit 5 to scan and generate detection data of each horizontal range within the overhead buffer 4 during movement process, and sends the detection data of each horizontal range within the overhead buffer 4 to the overhead hoist transport controlling system, and the overhead hoist transport controlling system bases on the detection data of each horizontal range within the overhead buffer 4 to judge whether there is obstacle in the overhead buffer 4.

The overhead buffer double-entry detection system according to the present application makes use of a first sensing unit capable of scanning and generating detection data of a horizontal range, in combination with a driving device capable of bringing the first sensing unit into movement in a vertical range, whereby the first sensing unit is enabled to scan and generate detection data of each horizontal range within the overhead buffer, detection result of three-dimensional space range is obtained according to the two-dimensional detections along the horizontal direction and the vertical direction, and precision judgment is made as to whether there is obstacle. The system according to the present application is suitable for detecting various objects including conventional FOUP 2, lesser obstacle object 2a, FOSE-type FOUP 2b, etc., enhances detection precision, and avoids miss detections and erroneous detections.

Figure 8:
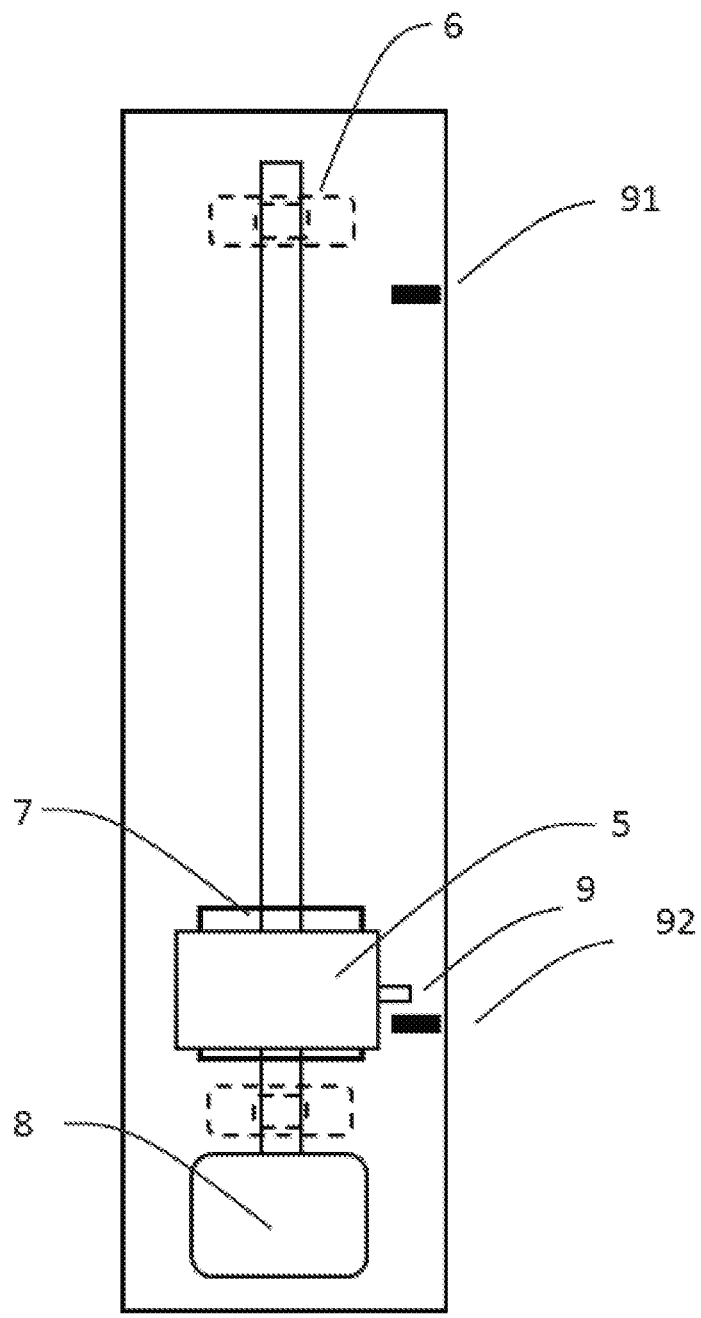
FIG. 8 is a diagram schematically illustrating the driving device of the overhead buffer double-entry detection system according to the present application.

In one of the embodiments, as shown in FIGS. 7 and 8, the driving device is embodied as a leading screw mechanism that usually includes a leading screw 6, a sliding block 7 disposed on the leading screw 6, and a motor 8 connecting the leading screw 6; the first sensing unit 5 is disposed on the sliding block 7 of the leading screw mechanism; specifically, the first sensing unit 5 can be fixedly disposed on the sliding block 7 of the leading screw mechanism via, but not restricted to be via, a connection board (not shown); the controlling unit enables the sliding block 7 to bring the first sensing unit 5 into movement in the vertical range by driving the motor 8 of the leading screw mechanism, as shown in FIG. 8, specifically, when the motor 8 rotates clockwise under drive by the controlling unit, the leading screw 6 rotates clockwise to bring the sliding block 7 upwards and the first sensing unit 5 also upwards at the same time; when the motor 8 rotates counterclockwise under drive by the controlling unit, the leading screw 6 rotates counterclockwise to bring the sliding block 7 downwards and the first sensing unit 5 also downwards at the same time.

In one of the embodiments, definition of the vertical range 52 can be completed via a pair of sensing units; by way of example, on the driving device is disposed a second sensing unit 91 connected to the controlling unit for outputting a first sensing signal when the first sensing unit 5 is moved to an upper limit of the vertical range 52; on the driving device is disposed a third sensing unit 92 connected to the controlling unit for outputting a second sensing signal when the first sensing unit 5 is moved to a lower limit of the vertical range 52; the controlling unit is employed to base on the first sensing signal and the second sensing signal to control the first sensing unit 5 to move only in the vertical range defined by the second sensing unit 91 and the third sensing unit 92, while the movement direction can be upwards or downwards, to which no restriction is made here, insofar as it is possible to detect the detection data of the corresponding horizontal range 511 within each vertical range during the movement process.

By way of example, the second sensing unit 91 and the third sensing unit 92 can both be embodied as laser sensors, in this embodiment, U-shaped lasers can be used for instance; correspondingly, it suffices to provide a block piece 9 capable of penetrating the U-shaped sensors during the movement process at a corresponding position of the first sensing unit 5 or the sliding block 7; when the block piece 9 on the first sensing unit 5 or the sliding block 7 arrives at the U-shaped sensor of the second sensing unit 91 during the movement process, the second sensing unit 91 sends a first sensing signal to the controlling unit, and the controlling unit judges the upper limit of movement of the first sensing unit 5 in the vertical range 52 on the basis of the received first sensing signal; likewise, the controlling unit judges the lower limit of movement of the first sensing unit 5 in the vertical range 52 upon reception of the second sensing signal.

By way of example, the controlling unit can control the first sensing unit 5 to start scanning from the lower limit position of the vertical range (the position where the third sensing unit 92 locates) on the basis of the first sensing signal and the second sensing signal, and to stop scanning when it is moved to the upper limit position of the vertical range (the position where the second sensing unit 91 locates), and the process is homed to the lower limit position to wait for the next round of detection. As an variant example, it is also possible to start scanning from the upper limit position of the vertical range (the position where the second sensing unit 91 locates) and stops scanning when it is moved to the lower limit position of the vertical range (the position where the third sensing unit 92 locates), and the process is homed to the upper limit position to wait for the next round of detection; of course, the controlling unit can be further designed to perform cycled scanning detection mode without homing, that is to say, if the previous scanning is downwards, the next scanning will be upwards, and such an alternate scanning mode can effectively shorten the movement period of the first sensing unit 5; as should be noted, when this scanning mode is employed, no scanning is performed within the period from the end of the previous scanning until the movement of the overhead hoist transport to the next overhead buffer, and the next scanning will be resumed only when the overhead hoist transport moves to the next overhead buffer, so as to avoid imprecise detection result caused by persistent scanning while the overhead hoist transport is moving.

By way of example, the vertical range 52 at least includes a region ranging from a bottom edge 41 of the obstacle on the overhead buffer 4 to a top edge 121 of a load transfer part 12 of the overhead hoist transport 1. Usually the bottom of the FOUP 2 or the FOSE-type FOUP 2b is on the same horizontal surface as the upper surface of the base of the overhead buffer 4; when the overhead hoist transport 1 places a FOUP on the base of the overhead buffer, it is the load transfer part 12 that brings the FOUP firstly to protrude out and then places it on the base of the overhead buffer 4; in order to provide enough action space for the load transfer part 12 and the FOUP, the vertical range is therefore set as a region ranging from a bottom edge (or the upper surface of the base of the overhead buffer 4) of the obstacle on the overhead buffer 4 to a top edge of the load transfer part 12 of the overhead hoist transport 1, namely that part of the region ranging from the bottom of the FOUP to the top edge of the load transfer part 12; as should be noted, when there is no obstacle on the overhead buffer, the position of the bottom edge 41 of the obstacle indicated by the vertical range 52 to be detected is actually the position of the upper surface of the base of the overhead buffer 4, it is therefore understandable that the bottom edge 41 of the obstacle in the vertical range 52 is in fact a virtual position representation merely to embody the lowest point of the obstacle possibly existent in the space, rather than necessarily indicating the bottom edge of a specific obstacle. The horizontal range 511 at least includes the range of a region where the obstacle on the overhead buffer 4 is located, for example, the range of horizontal region where the leftmost side to the rightmost side of the obstacle locates; scanned information of the horizontal range 511 can be set via corresponding software, specifically, differentiation is realized by setting positional coordinates (X/Y). The detection mode of a three-dimensional scanning space defined by the aforementioned vertical range 52 and the horizontal range 511 achieves higher detection precision than detection with a conventional photoelectric sensor.

Figure 9:
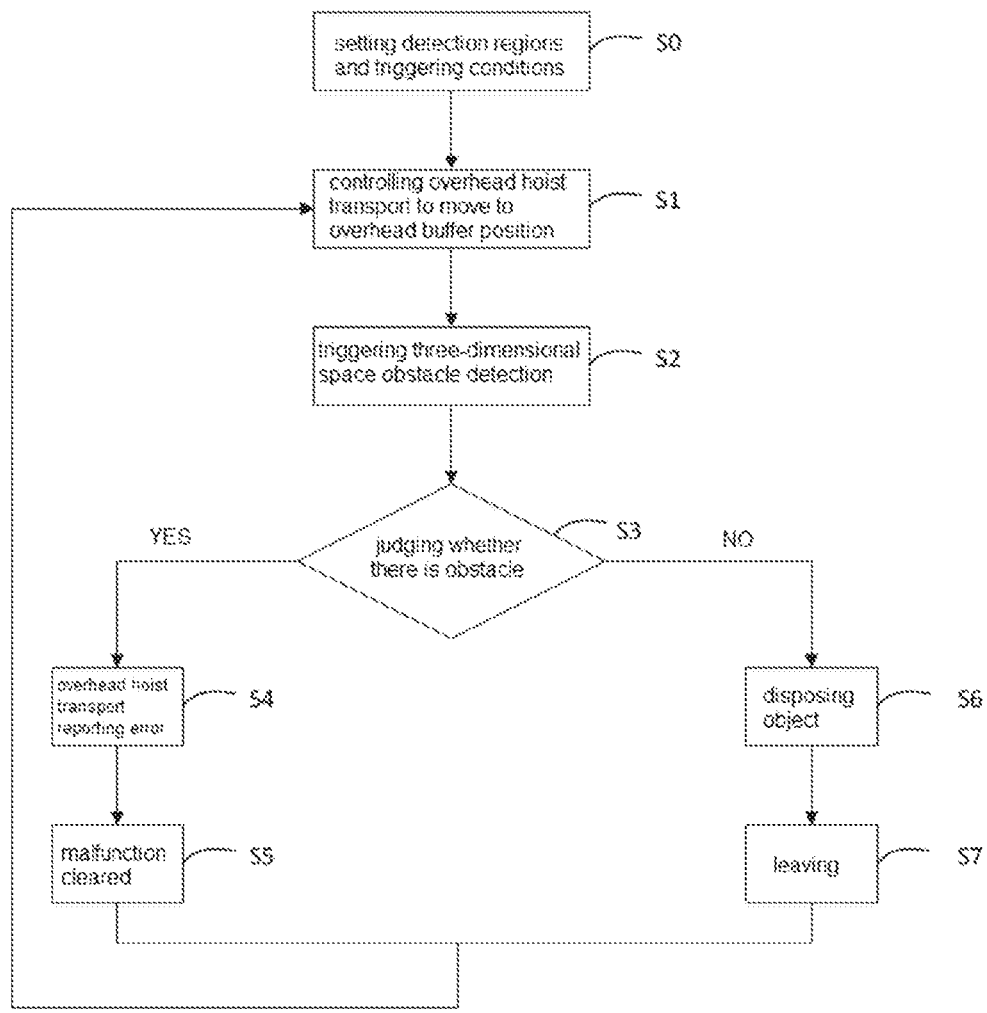
FIG. 9 is a flowchart illustrating the overhead buffer double-entry detecting method according to the present application.

As shown in FIG. 9, the present application further provides an overhead buffer double-entry detecting method, which can be, but is not restricted to be, realized by the aforementioned overhead buffer double-entry detection system. The overhead buffer double-entry detecting method comprises the following steps:

S1. controlling an overhead hoist transport 1 to move to a corresponding position of an overhead buffer 4;

S2. triggering three-dimensional space obstacle detection, specifically, triggering a first sensing unit 5, controlling a driving device to move the first sensing unit 5 in a vertical range, and enabling the first sensing unit 5 to scan and generate detection data of each horizontal range within the overhead buffer 4 during movement process, wherein the driving device is disposed on the overhead hoist transport 1, and the first sensing unit 5 is connected to the driving device; and S3. basing on the detection data of each horizontal range within the overhead buffer 4 to judge whether there is obstacle in the overhead buffer 4.

By way of example, when obstacle exists, the process jumps to step S4; when no obstacle exists, the process jumps to step S6;

S4. basing on detection data of each horizontal range within the overhead buffer to judge types of obstacles—specifically, the overhead hoist transport controlling system synthesizes the shapes and sizes of obstacles detected at each horizontal surface on the vertical direction, so as to judge the types of the obstacles, such as FOUPs or other objects hindering disposal of the overhead hoist transport; and basing on different types of the obstacles to make corresponding warning reminders;

S5. waiting for operating personnel to check the warning reminders on the site, and the process then returning to step S1;

S6. the overhead hoist transport 1 disposing objects; and

S7. the overhead hoist transport 1 leaving, the process returning to step S1 after acquiring the next FOUP to perform the next disposal.

In one of the examples, before the overhead hoist transport 1 is controlled to move to a corresponding position of the overhead buffer 4 is further included the following step:

S0. setting detection regions and triggering conditions, the detection regions including horizontal ranges scannable by the first sensing unit 5 and vertical ranges required for the first sensing unit 5 to be moved; wherein the detection range of the horizontal range 511 at least includes the horizontal range in which the obstacle on the overhead buffer 4 is located, the vertical range 52 at least includes a region ranging from a bottom edge of the obstacle on the overhead buffer 4 to a top edge of the load transfer part 12 of the overhead hoist transport 1, and the triggering conditions include movement of the overhead hoist transport 1 to a corresponding overhead buffer 4.

In one of the embodiments, in step S2, after the first sensing unit 5 is triggered, the first sensing unit 5 starts scanning from the lower edge position of the obstacle on the overhead buffer 4, and stops scanning when it is moved to the upper edge position of the load transfer part 12 of the overhead hoist transport 1 under control of the driving device.

The various technical features of the aforementioned embodiments can be randomly combined; for the sake of brevity, all possible combinations of the various technical features of the aforementioned embodiments are not exhausted; however, insofar as the combinations of the technical features are not contradictory to one another, they shall all be regarded as within the scope described in this Description.

The aforementioned embodiments merely indicate several modes to implement the present application, and their descriptions are relatively specific and detailed, but they should not be therefore understood as restriction to the inventive patent scope. As should be pointed out, persons ordinarily skilled in the art may make various modifications and improvements without departing from the conception of the present application, and all such modifications and improvements shall fall within the protection scope of the present application. Accordingly, the protection scope of the present application shall be as claimed in the attached Claims.

The invention claimed is:

1. An overhead buffer double-entry detection system, comprising:

an overhead hoist transport;

a first sensing unit, for scanning and generating detection data of a horizontal range;

a driving device, disposed on the overhead hoist transport, and connected to the first sensing unit, for moving the first sensing unit in a vertical range;

a controlling unit, connected to the driving device and the first sensing unit respectively; and an overhead hoist transport controlling system, connected to the overhead hoist transport and the controlling unit respectively, for sending a detection instruction and a driving instruction to the controlling unit when the overhead hoist transport moves to a corresponding overhead buffer position, whereby the controlling unit bases on the driving instruction to control the driving device to move the first sensing unit in a vertical range, bases on the detection instruction to control the first sensing unit to scan and generate detection data of each horizontal range within the overhead buffer during movement process, and sends the detection data of each horizontal range within the overhead buffer to the overhead hoist transport controlling system, and the overhead hoist transport controlling system bases on the detection data of each horizontal range within the overhead buffer to judge whether there is obstacle in the overhead buffer.

2. The overhead buffer double-entry detection system according to claim 1, wherein:

the driving device is a leading screw mechanism;

the first sensing unit is disposed on a sliding block of the leading screw mechanism; and the controlling unit drives a motor of the leading screw mechanism to enable the sliding block to bring into movement the first sensing unit in a vertical range.

3. The overhead buffer double-entry detection system according to claim 2, further comprising:
   a second sensing unit, connected to the controlling unit, for outputting a first sensing signal when the first sensing unit is moved to an upper limit of the vertical range; and
   a third sensing unit, connected to the controlling unit, for outputting a second sensing signal when the first sensing unit is moved to a lower limit of the vertical range; wherein
   the controlling unit is further employed to base on the first sensing signal and the second sensing signal to control the first sensing unit to start scanning from lower limit position of the vertical range and to stop scanning when it is moved to upper limit position of the vertical range.

4. The overhead buffer double-entry detection system according to claim 3, wherein the second sensing unit and the third sensing unit are respectively laser sensors.

5. The overhead buffer double-entry detection system according to claim 1, wherein the vertical range at least includes a region ranging from a bottom edge of the obstacle on the overhead buffer to a top edge of a load transfer part of the overhead hoist transport.

6. The overhead buffer double-entry detection system according to claim 1, wherein the horizontal range at least includes the range of a region where the obstacle on the overhead buffer is located.

7. The overhead buffer double-entry detection system according to claim 4, wherein the laser sensors are U-shaped sensors; and a block piece capable of penetrating the U-shaped sensors during the movement process is disposed at a corresponding position of the first sensing unit or the sliding block.

8. An overhead buffer double-entry detecting method, characterized in comprising:
   controlling an overhead hoist transport to move to a corresponding position of an overhead buffer;
   triggering a first sensing unit, controlling a driving device to move the first sensing unit in a vertical range, and enabling the first sensing unit to scan and generate detection data of each horizontal range within the overhead buffer during movement process, wherein the driving device is disposed on the overhead hoist transport, and the first sensing unit is connected to the driving device; and
   basing on the detection data of each horizontal range within the overhead buffer to judge whether there is obstacle in the overhead buffer.

9. The overhead buffer double-entry detecting method according to claim 8, wherein, before the overhead hoist transport moves to a corresponding position of the overhead buffer, the method further comprises:
   setting detection range of horizontal range of the first sensing unit and vertical range moved by the first sensing unit;
   wherein the horizontal range at least includes a range of a region where the obstacle on the overhead buffer is located, and the vertical range at least includes a region ranging from a bottom edge of the obstacle on the overhead buffer to a top edge of a load transfer part of the overhead hoist transport.

10. The overhead buffer double-entry detecting method according to claim 9, wherein, after the first sensing unit is triggered, the first sensing unit starts scanning from bottom edge position of the obstacle on the overhead buffer, and stops scanning when it is moved under control of the driving device to top edge position of the load transfer part of the overhead hoist transport.

11. The overhead buffer double-entry detecting method according to claim 9,
   wherein, after judging whether there is obstacle in the overhead buffer, the method further comprises:
   basing on detection data of each horizontal range within the overhead buffer to judge types of the obstacle; and
   basing on different types of the obstacle to make corresponding warning reminders.

12. The overhead buffer double-entry detecting method according to claim 8, wherein, before controlling the overhead hoist transport to move to a corresponding position of the overhead buffer, the method further comprises:
   setting detection regions and triggering conditions, the detection regions including horizontal range scannable by the first sensing unit and vertical range required for the first sensing unit to be moved;
   wherein the detection range of the horizontal range at least includes the horizontal range in which the obstacle on the overhead buffer is located, the vertical range at least includes a region ranging from a bottom edge of the obstacle on the overhead buffer to a top edge of the load transfer part of the overhead hoist transport, and the triggering conditions include movement of the overhead hoist transport to a corresponding load transfer part of the overhead buffer.

* * * * *